US010211121B2

United States Patent
Nuttall

(10) Patent No.: US 10,211,121 B2
(45) Date of Patent: *Feb. 19, 2019

(54) HEAT SINK FOR A SEMICONDUCTOR CHIP DEVICE

(71) Applicant: Elenion Technologies, LLC, New York, NY (US)

(72) Inventor: Nathan A. Nuttall, Castaic, CA (US)

(73) Assignee: Elenion Technologies, LLC, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/826,165

(22) Filed: Nov. 29, 2017

(65) Prior Publication Data

US 2018/0090410 A1    Mar. 29, 2018

Related U.S. Application Data

(63) Continuation of application No. 15/370,307, filed on Dec. 6, 2016, now Pat. No. 9,859,186, which is a continuation of application No. 14/876,933, filed on Oct. 7, 2015, now Pat. No. 9,543,226.

(51) Int. Cl.
| | | |
|---|---|---|
| H01L 23/34 | (2006.01) | |
| H01L 23/367 | (2006.01) | |
| H01L 23/13 | (2006.01) | |
| H01L 25/07 | (2006.01) | |
| H01L 23/552 | (2006.01) | |
| G02B 6/42 | (2006.01) | |
| H01L 23/48 | (2006.01) | |
| H01L 25/16 | (2006.01) | |
| H01L 23/373 | (2006.01) | |

(52) U.S. Cl.
CPC ........ *H01L 23/3672* (2013.01); *G02B 6/4243* (2013.01); *G02B 6/4269* (2013.01); *G02B 6/4274* (2013.01); *H01L 23/13* (2013.01); *H01L 23/3675* (2013.01); *H01L 23/373* (2013.01); *H01L 23/481* (2013.01); *H01L 23/552* (2013.01); *H01L 25/071* (2013.01); *H01L 25/167* (2013.01); *H01L 23/3736* (2013.01)

(58) Field of Classification Search
CPC ................. H01L 23/552; H01L 23/481; H01L 23/3672; H01L 25/167; H01L 23/13; H01L 23/3675; H01L 23/373; H01L 23/3736; H01L 25/071; G02B 6/4243; G02B 6/4269; G02B 6/4274
See application file for complete search history.

(56) References Cited

U.S. PATENT DOCUMENTS

| | | | |
|---|---|---|---|
| 4,561,011 A | 12/1985 | Kohara | |
| 6,281,573 B1 | 8/2001 | Atwood | |
| 6,577,504 B1 | 6/2003 | Lofland | |
| 6,816,378 B1 | 11/2004 | Belady | |
| 9,859,186 B2 * | 1/2018 | Nuttall | ................ H01L 23/3672 |
| 2006/0087009 A1 | 4/2006 | Yang | |
| 2015/0257249 A1 | 9/2015 | Kim | |

FOREIGN PATENT DOCUMENTS

| | | |
|---|---|---|
| DE | 102013114928 | 7/2014 |
| JP | 4-263457 | 9/1992 |
| TW | 200306471 | 11/2003 |
| TW | 200614440 | 5/2006 |
| TW | 200828566 | 7/2008 |
| TW | 200941659 | 10/2009 |

OTHER PUBLICATIONS

International Search Report in International Application No. PCT/US2016/055363, dated Jan. 18, 2017 (4 pages).
Written Opinion of the International Searching Authority in International Application No. PCT/US2016/055363, dated Jan. 18, 2017 (5 pages).
Office Action and Search Report of the Taiwan Intellectual Property Office in corresponding Taiwanese Patent Application No. 105132662, dated Oct. 20, 2017 (3 pages) (translation only).

* cited by examiner

*Primary Examiner* — Jasmine Clark
(74) *Attorney, Agent, or Firm* — Nixon Peabody LLP

(57) ABSTRACT

A heat sink for a semiconductor chip device includes cavities in a lower surface thereof for receiving electrical components on a top surface of the semiconductor chip, and a pedestal extending through an opening in the semiconductor chip for contacting electrical components on a bottom surface of the semiconductor chip. A lid may also be provided on the bottom surface of the semiconductor chip for protecting the electrical components and for heat sinking the electrical components to an adjacent device or printed circuit board.

21 Claims, 3 Drawing Sheets

HEAT SINK FOR A SEMICONDUCTOR CHIP DEVICE

CROSS-REFERENCE TO RELATED APPLICATIONS

This application is a continuation of U.S. patent application Ser. No. 15/370,307, filed Dec. 6, 2016, now U.S. Pat. No. 9,859,186, which is a continuation of U.S. patent application Ser. No. 14/876,933, filed Oct. 7, 2015, now U.S. Pat. No. 9,543,226, both of which are hereby incorporated by reference herein in its entireties.

TECHNICAL FIELD

The present invention relates to a heat sink for a semiconductor chip device, and in particular to a heat sink for a dual-sided semiconductor chip device.

BACKGROUND

As electrical power dissipation increases in electronic integrated circuits (IC) or photonic integrated circuit (PIC), keeping the operational temperatures of every component of a semiconductor chip device within an acceptable range using traditional electronic packaging methods becomes increasingly more difficult.

IC devices are typically bonded to a substrate of some kind, which includes electrical traces extending out to the edge of the package with additional electronic components connected along the way. If the power dissipation of the device is high, the substrate may be bonded to a heat sink for dissipating heat. However, the interface between the substrate and the heat sink can prove to be a significant thermal barrier, thereby increasing operational temperatures beyond what is required by the device to operate efficiently. Furthermore, it is usually only possible to direct the excess heat from the device along one interface, e.g. toward the heat sink. With a mixture of components, which are bonded in a variety of different ways, e.g. ball grid array (BGA) and direct bonding methods, optimally dissipating heat from all the components on the substrate becomes increasingly more difficult.

An object of the present invention is to overcome the shortcomings of the prior art by providing a heat sink for a dual-sided semiconductor chip device.

SUMMARY OF THE INVENTION

In accordance with one embodiment, a semiconductor chip device comprises a substrate including first and second sides, and an opening extending through the substrate between the first and second sides; first opto-electronic or electronic components mounted on the first and second sides; a heat sink mounted on the first surface in thermal contact with the components on the first side, and including an extension extending through the opening with an exposed surface parallel with the second side; and at least one second opto-electronic or electronic components mounted on the exposed surface of the extension; wherein the heat sink provides a first thermally-conductive path for the first components on the first side and each of the second components on the exposed surface.

In accordance with a modified embodiment, a heat sink comprises a base for mounting on a first side of a substrate; thermally conductive pins or fins extending from a first side of the base away from the substrate providing a first thermally conductive path; cavities extending into a second side of the base for receiving opto-electronic or electronic components mounted on the first side of the substrate for physically and RF shielding the opto-electronic or electronic components; and an extension extending from the second side of the base to extend through an opening in the substrate to a second side of the substrate.

BRIEF DESCRIPTION OF THE DRAWINGS

The invention will be described in greater detail with reference to the accompanying drawings which represent preferred embodiments thereof, wherein.

DETAILED DESCRIPTION

While the present teachings are described in conjunction with various embodiments and examples, it is not intended that the present teachings be limited to such embodiments. On the contrary, the present teachings encompass various alternatives and equivalents, as will be appreciated by those of skill in the art.

Figure 1:
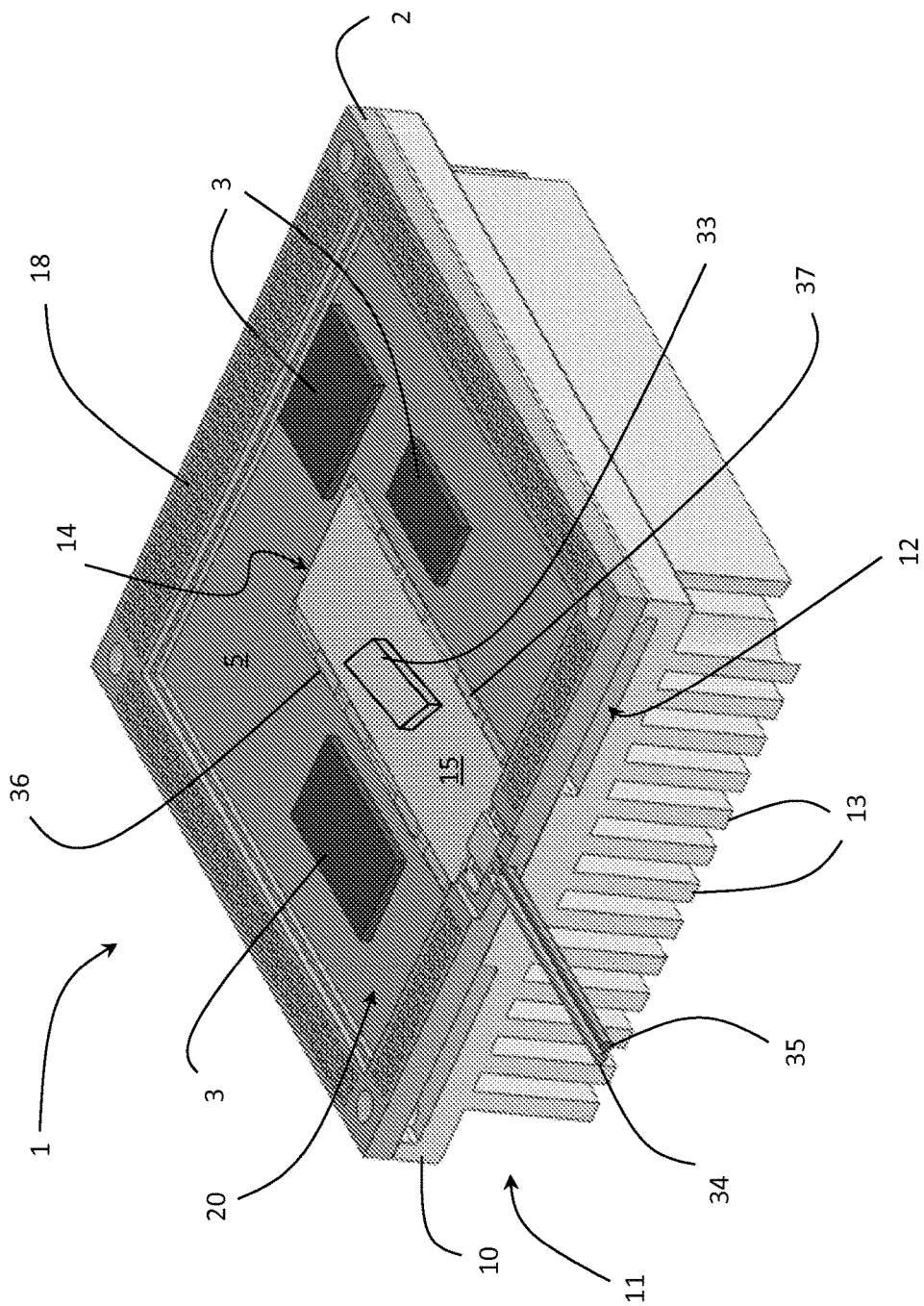
FIG. 1 is a diagram of an isometric view of a semiconductor chip device of the present invention.
Figure 2:
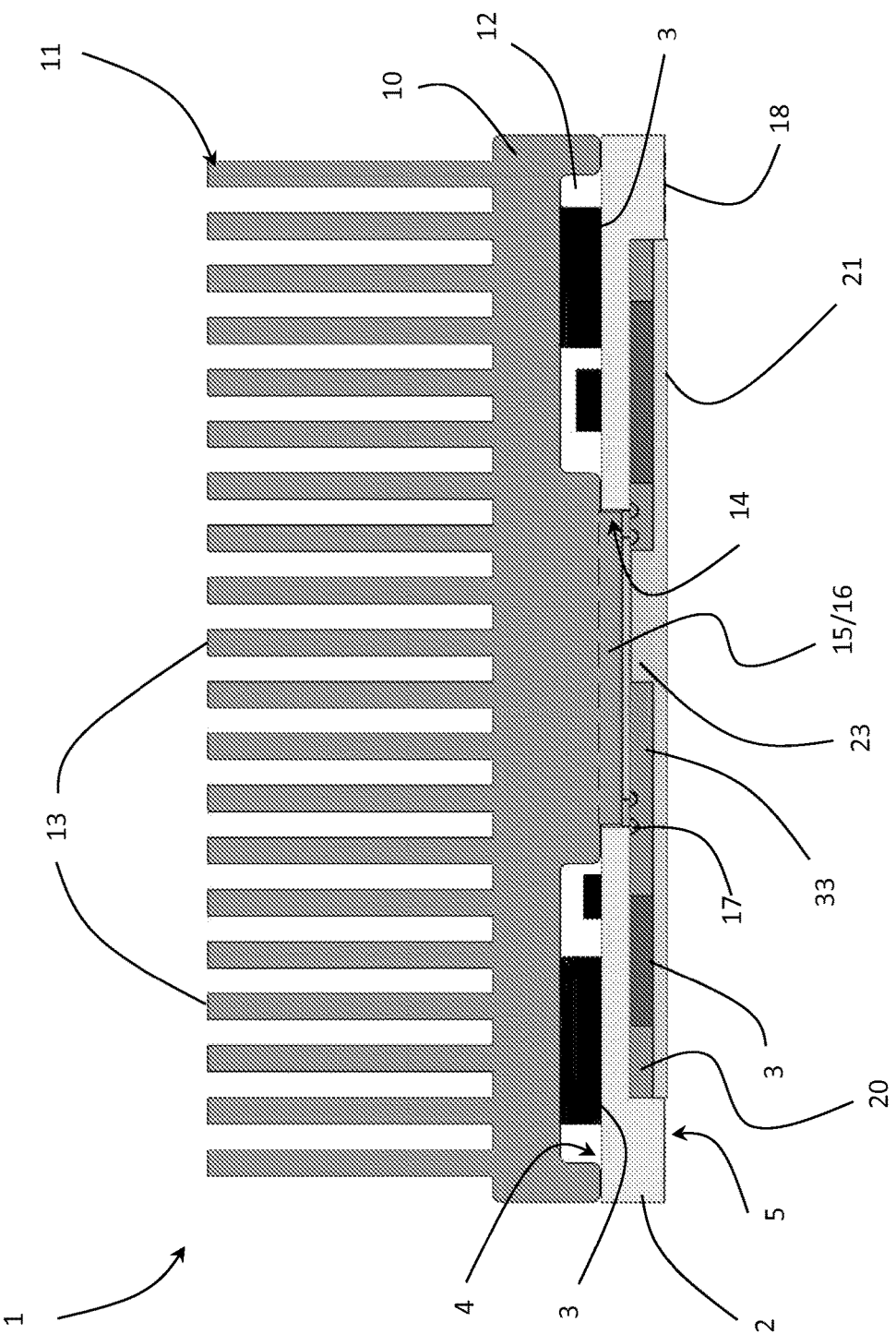
FIG. 2 is a diagram of a side view of the semiconductor chip device of FIG. 1.
Figure 3:
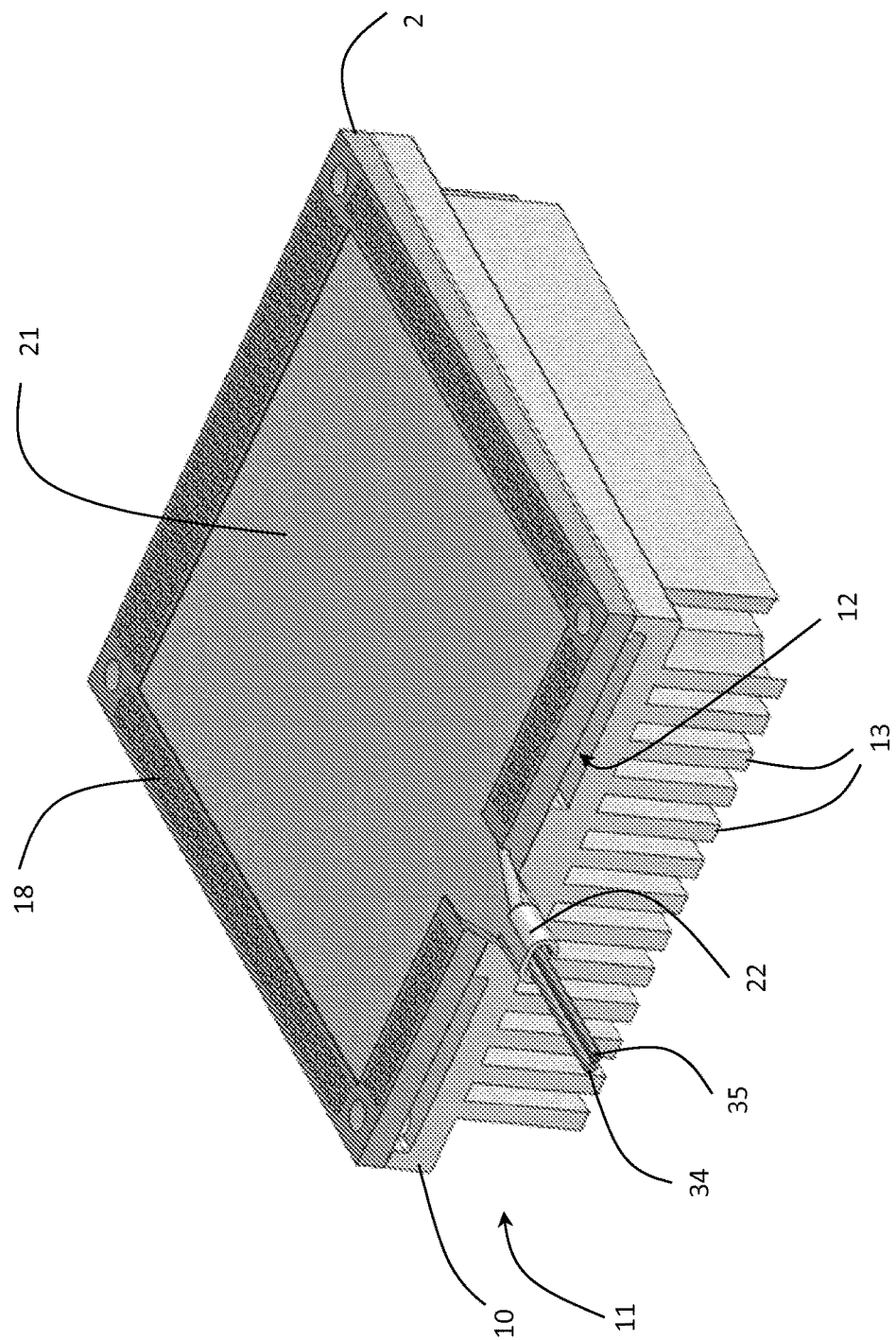
FIG. 3 is diagram of an isometric view of the semiconductor chip device of FIG. 1 including a bottom lid.

With reference to FIGS. 1 and 2, an electronic (IC) or opto-electronic (PIC) chip device 1 includes a substrate 2, comprising, for example, a semiconductor printed circuit board (PCB) or a more thermally conductive material, such as aluminum nitride. Active opto-electronic and/or electronic components 3 are mounted on first and second surfaces or sides 4 and 5, respectively, of the substrate 2. In the illustrated embodiment the first and second surfaces or sides 4 and 5 are opposite upper and lower surfaces or sides of the substrate 2. A heat sink 11 is mounted on one of the first and second surfaces or sides 4 and 5, respectively, and includes a base 10 with one or more cavities 12 extending into the base 10 from a bottom surface thereof, and heat dissipated pins or fins 13 extending outwardly, e.g. upwardly, from an upper side thereof to facilitate heat dissipation away from the substrate 2. The depth of each of the cavities 12 may be substantially the same as the height of a corresponding one of the components 3 received therein, so that the corresponding components 3 may be bonded directly to the bottom surface of the cavities 12 in the heat sink 11 for conducting heat, while the base 10 of the heat sink 11 may still be coupled to the substrate 2, at least partially around the periphery thereof, e.g. along side walls of the base 10.

Ideally, the heat sink 11 is comprised of a thermally and electrically conductive material, e.g., a metal, such as an aluminum alloy (167 W/m° K) or copper (350 W/m° K), which has a thermal conductivity greater than 150 W/m° K. Since the heat sink 11 conducts electricity, the heat sink 11 may become an electrical ground for the components 3, and may also provide RF shielding, if the components 3 and the heat sink 11 are bonded using an electrical conductive material, such as solder or conductive epoxy such as a silver-filled epoxy.

The substrate 2 includes at least one opening 14 extending therethrough from the first surface 4 to the second surface 5 for receiving a heat sink extension, e.g. a pedestal portion 15, extending from a bottom surface of the base 10 of the heat sink 11 below the plane of the bottom surface of the base 10. The pedestal portion 15 may be fixed to the substrate 2 using an epoxy or solder at the edge of the opening 14 and the periphery of the pedestal portion 15. The pedestal portion 15 may extend through the opening 14, whereby an exposed surface of the pedestal portion 15 is parallel to or ideally coplanar with the second surface 5 of the substrate 2.

One or more high power IC or PIC 33 may be mounted directly on the exposed surface of the pedestal portion 15. The high power PICs may comprise a laser for generating an optical signal for transmission on a first optical fiber 34 optically coupled to one of the high power PICs 33, e.g. to an edge of the substrate 2. The high power PICs 33 may also include a photodetector for receiving light from a second optical fiber 35 optically coupled to the photodetector, e.g. to an edge of the substrate 2, thereby forming a bidirectional transceiver. The high power PIC's may also include transimpedance amplifier (TIA) chips 36 and RF laser drivers 37.

The heat sink 11 may be manufactured in an extrusion process, thereby making the cross section, i.e. the cavities 12, the side walls of the base 10, and the pedestal portion 15, the same relative heights and widths along the length of the heat sink 11, and the ends of the heat sink 11 open. However, the open ends of the heat sink 11 may be closed off by soldering a block to the substrate 2, e.g. soldered at the same time as the components 3, which would prevent warping of the substrate 2 when under clamping pressure. Moreover, a closed off cavity 12 may improve physical and RF shielding of the components 3, if necessary. However, having air flow through the cavities 12, when the ends are open, may be beneficial in terms of heat removal, for some applications.

Optionally, instead of the pedestal portion 15 being a single monolithic structure, i.e. integral with the remainder of the heat sink 11, the heat sink 11 may include one or more separate heat spreaders 16 attached to the bottom surface of the base 12 of the heat sink 11 to extend through the at least one opening 14 for supporting the high power IC' or PIC's 33 on a exposed surface of the heat spreader 16 to at least partially compensate for possible thermal expansion or bonding issues between the heat sink 11 and the high power IC's 33. The optional heat spreader 16 may be comprised of a material with high thermal conductivity, e.g. greater than 150 W/mK, preferably greater than 175 W/m° K, but with a lower coefficient of thermal expansion (CTE), e.g. less than $20 \times 10^{-6}$ m/(m° K) @ 25° C., preferably less than $10 \times 10^{-6}$ m/(m° K) @ 25° C. than the heat sink 11. Examples of suitable materials are copper (I>400 W/m° K, a<$16.8 \times 10^{-6}$ m/(m° K @25° C.), CVD diamond (I>1800 W/m° K, a<$10 \times 10^{-6}$/K @25° C.), AlSiC (I>170 W/m° K, a<$10.9 \times 10^{-6}$ m/(m° K) @25° C.), Aluminum-Nitride (I>170 W/m° K, a<$4.2 \times 10^{-6}$ m/(m° K) @° 25 C), Copper-Tungsten (I>170 W/m° K, a<$8.3 \times 10^{-6}$ (m/m° K) @ 25° C.) or other high thermal conductivity and low thermal expansion material.

Electrical connection may be made between the high power IC's 33 and to the substrate 2 by using wire-bonds 17 or other suitable methods and structures. The substrate 2 may also be bonded to the heat sink 11, but possibly at a different level than the high power IC's or PIC's 33 to keep the active top layer of the high power IC's or PIC's 33 at the same planar level to benefit high frequency performance.

The second surface 5 of the substrate 2 may include a recess 20 or be tiered, for receiving the components 3 at a bottom of the recess 20 or on a lower tier. Electrical contacts 18 may be provided on an upper tier of the second surface 5, e.g. on side walls surrounding the recess 20, for electrically connecting the components 3 and the high power ICs or PICs 33, via integrated or wire bonded leads, to mating electrical contacts on a connecting device, e.g. a connecting PCB. The electrical connector 18 may be comprised of suitable components for a ball grid array (BGA), a land grid array (LGA) or a pin grid array (PGA). The side walls of the recess 20 may extend upwardly higher than the components 3 and the high power ICs or PICs 33, thereby providing physical and RF protection therefor.

A thermally conductive cover or lid 21 may be mounted over the second surface 5 of the substrate 2 to cover the recess 20 and the components 3, along with all the wire-bonds 17, and to make contact with non-sensitive portions of the components 3 and the high power ICs or PICs 33 mounted on the second surface 5 of the substrate 2 for the purpose of providing a more direct path of heat dissipation for the components 3 and the high power ICs or PICs 33 on the second side of the substrate 2 and on the exposed surface of the pedestal 15 or the heat spreader 16. One or more feet 23 extend from the lid 21 into contact with the pedestal portion 15 or the heat spreader 16 for support/spacer for the lid 21 and to provide a second thermally conductive path from the components 3 and the high power ICs or PICs 33 on both the first and second surfaces 4 and 5 of the substrate 2. The second thermally conductive path may include the lid 21 making direct contact with the mating PCB with a compliant thermal interface material, such as a thermal epoxy, thermal pad or thermal grease. The contact from the lid 21 to the mating PCB may then be achieved down to a thermally conductive, e.g. copper, ground plane layer in the connecting PCB to dissipate heat through the connecting PCB.

Potting or conformal coating inside the lid 21 may also be an option to improve reliability and/or heat dissipation. A strain relief projection 22 may be provided extending from the lid 21, integral therewith, to at least partially surround the ends of the first and second optical fibers 34 and 35, where they are coupled to the edge of the substrate 2. The thermally conductive lid 21 may be comprised of a thermally and electrically conductive material having a thermal conductivity of at least 150 W/m° K, such as a metal, e.g. aluminum alloy 6061 (167 W/m° K) or copper (350 W/m° K).

Accordingly, the electro-optical and electronic components 3 may be attached to the top and bottom surfaces 4 and 5 of the substrate 2 and still heat sink to both sides. This is achieved by incorporating each of the cavities 12 in the heat sink 11 to provide room for the components 3 on the first surface 4, and the recess 20 in the substrate 2 to provide a place for electronics on the bottom side 5. Components 3 on the first surface 4 may make direct contact with the heat sink 11, while components 3 on the bottom surface 5 may make thermal contact to the heat sink 11 and/or the bottom lid 21 to heat sink to the connecting PCB. Thus, every component 3 and high power IC or PIC 33 may be heat sunk in both thermally conductive path, e.g., opposite, directions and more area is provided on the substrate 2 to place electrical components 3 in a given volume.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A semiconductor chip device comprising:
a substrate including first and second sides, and an opening extending through the substrate between the first and second sides;
first opto-electronic or electronic components mounted on the first side;
second opto-electronic or electronic components mounted on the second side;
a heat sink mounted over the first surface in thermal contact with the first components for dissipating heat from the second components; and
an extension extending through the opening in thermal contact with the heat sink for dissipating heat from the second components.

2. The device according to claim 1, further comprising:
a thermally-conductive cover mounted over the second side of the substrate in thermal contact with the extension and the second components for dissipating heat from the second components.

3. The device according to claim 2, wherein the substrate includes a thermally conductive ground plane layer; and wherein the thermally conductive cover is in thermal contact with the thermally conductive ground plane layer to dissipate heat therethrough.

4. The device according to claim 1, wherein at least one of the second opto-electronic or electronic components is mounted on an exposed surface of the extension.

5. The device according to claim 1, wherein the heat sink comprises a base with heat dissipating pins or fins extending outwardly therefrom, and the extension extending from the base through the opening; and
wherein the heat sink comprises a single monolithic structure of thermally conductive material.

6. The device according to claim 1, wherein the heat sink comprises a base with heat dissipating pins or fins extending outwardly therefrom; and
wherein the extension comprises a heat spreader section comprised of a material with a coefficient of thermal expansion lower than that of the base.

7. The device according to claim 4, wherein the heat spreader material has a coefficient of thermal expansion of less than $20 \times 10^{-6}$ m/(m° K) @ 25° C., and a thermal conductivity greater than 150 W/mK.

8. The device according to claim 4, wherein the heat spreader material has a coefficient of thermal expansion of less than $10 \times 10^{-6}$ m/(m° K) @ 25° C., and a thermal conductivity greater than 175 W/mK.

9. The device according to claim 1, wherein the heat sink includes a base in contact with the substrate;
wherein the base includes cavities therein for receiving the first components on the first side of the substrate, thereby physically and RF shielding the first components on the first side; and
wherein the first components on the first side are in thermal contact with corresponding bottoms of the cavities.

10. The device according to claim 2, wherein the thermally-conductive cover includes feet extending into contact with the extension, thereby thermally coupling the first components to the thermally conductive cover, and the second components to the heat sink.

11. The device according to claim 1, wherein the second side of the substrate includes a recess surrounded by side walls for receiving the second components; and wherein the side walls extend higher than the second components in the recess in the second side.

12. The device according to claim 2, wherein the thermally conductive cover has a thermal conductivity greater than 150 W/mK.

13. A heat sink system comprising:
a base adapted for mounting over a first side of a substrate in thermal contact with first opto-electronic or electronic components on a first side of the substrate for dissipating heat from the first components;
thermally conductive pins or fins extending from a first side of the base away from the substrate providing a first thermally conductive path;
an extension extending from a second side of the base to extend through an opening in the substrate to a second side of the substrate for dissipating heat from second opto-electronic or electronic components on a second side of the substrate.

14. The system according to claim 13, further comprising a thermally-conductive cover capable of mounting over the second side of the substrate in contact with the extension and with second opto-electronic or electronic components on the second side of the substrate for dissipating heat therefrom.

15. The system according to claim 13, wherein the base, the thermally conductive pins and the extension comprises a single monolithic structure of thermally conductive material.

16. The system according to claim 13, wherein the extension comprises a heat spreader section comprised of a material with a coefficient of thermal expansion lower than that of the base.

17. The system according to claim 16, wherein the heat spreader material has a coefficient of thermal expansion of less than $20 \times 10^{-6}$ m/(m° K) @ 25° C., and a thermal conductivity greater than 150 W/mK.

18. The system according to claim 16, wherein the heat spreader material has a coefficient of thermal expansion of less than $10 \times 10^{-6}$ m/(m° K) @ 25° C., and a thermal conductivity greater than 175 W/mK.

19. The system according to claim 13, wherein the base further comprises cavities extending into the second side of the base and configured to receive the first opto-electronic or electronic components mounted on the first side of the substrate to physically and RF shield the first opto-electronic or electronic components.

20. The system according to claim 14, wherein the thermally-conductive cover includes feet extending into contact with the extension, thereby thermally coupling the first opto-electronic or electronic components on the first side of the substrate to the thermally conductive cover, and the second opto-electronic or electronic components on the second side of the substrate to the heat sink.

21. The system according to claim 14, wherein the thermally conductive cover has a thermal conductivity greater than 150 W/mK.

* * * * *